United States Patent
Meijer et al.

(10) Patent No.: US 8,531,204 B2
(45) Date of Patent: Sep. 10, 2013

(54) TESTABLE INTEGRATED CIRCUIT AND TEST METHOD THEREFOR

(75) Inventors: Rinze Ida Mechtildis Peter Meijer, Herkenbosch (NL); Luis Elvira Villagra, Maastricht (NL)

(73) Assignee: NXP, B.V., Eindhoven (NL)

( * ) Notice: Subject to any disclaimer, the term of this patent is extended or adjusted under 35 U.S.C. 154(b) by 49 days.

(21) Appl. No.: 13/129,107

(22) PCT Filed: Nov. 10, 2009

(86) PCT No.: PCT/IB2009/054980
§ 371 (c)(1),
(2), (4) Date: May 12, 2011

(87) PCT Pub. No.: WO2010/055462
PCT Pub. Date: May 20, 2010

(65) Prior Publication Data
US 2011/0221502 A1  Sep. 15, 2011

(30) Foreign Application Priority Data
Nov. 13, 2008  (EP) .................................... 08105793

(51) Int. Cl.
*H03K 19/00* (2006.01)
*H03K 19/0175* (2006.01)
*H03L 5/00* (2006.01)

(52) U.S. Cl.
USPC ................................ 326/16; 326/62; 327/333

(58) Field of Classification Search
USPC ................ 326/62–63, 68, 80–81; 327/333
See application file for complete search history.

(56) References Cited

U.S. PATENT DOCUMENTS

| 7,348,796 | B2 * | 3/2008 | Crouch et al. ................... 326/38 |
| 7,493,434 | B1 * | 2/2009 | Abramovici .................. 710/118 |
| 7,500,204 | B2 | 3/2009 | De Gyvez et al. |
| 7,650,545 | B1 * | 1/2010 | Abramovici et al. ......... 714/726 |
| 2004/0212393 | A1 * | 10/2004 | Abramovici et al. ........... 326/38 |
| 2007/0229114 | A1 * | 10/2007 | Whetsel .......................... 326/47 |

(Continued)

FOREIGN PATENT DOCUMENTS

| WO | 2005/125012 A1 | 12/2005 |
| WO | 2006/111910 A2 | 10/2006 |
| WO | 2007/080527 A2 | 7/2007 |

OTHER PUBLICATIONS

Usami, Kimiyoshi, et al; "Clustered Voltage Scaling Technique for Low-Power Design"; Proc. of 1995 Intl Workshop on Low Power Design; pp. 3-8 (Apr. 1995).

(Continued)

*Primary Examiner* — Thienvu Tran (57) ABSTRACT

Disclosed is an integrated circuit (200) comprising a plurality of cores (110, 110), at least some of the cores being located in different power domains (VDD1, VDD2), each core being surrounded by a test wrapper (220) comprising a plurality of wrapper cells (128, 230), wherein each of said test wrappers are located in a single power domain (VDD3) and each plurality of wrapper cells comprises wrapper output cells (230) each arranged to output a signal from its associated core, each of said wrapper output cells comprising an output level shifter (232, 240) for shifting the voltage of said signal to the voltage of the single power domain (VDD3). A method for testing such an IC and standard library cells for designing such an IC are also disclosed.

15 Claims, 5 Drawing Sheets

(56) References Cited

U.S. PATENT DOCUMENTS

2008/0106327 A1 5/2008 Meijer et al.
2008/0195878 A1 8/2008 Meijer et al.
2011/0221502 A1* 9/2011 Meijer et al. .................. 327/333

OTHER PUBLICATIONS

Zorian, Y., et al.; "Testing Embedded-Core Based System Chips"; Proc. of Intl. Test Conference, 1998 vol. Conf. 29; Washington, DC, US; IEEE, New York, NY, US;pp. 130-143.

Kosonocky, S.V., et al.; "Enhanced Multi-Threshold (MTCOMOS) Circuits Using Variable Well Bias"; Proc. of ISLPED 2001, Huntington Beach, CA, US; pp. 165-169 (Aug. 2001).

Lackey, David E., et al.; "Managing Power and Performance for System-on-Chip Designs Using Voltage Islands"; Proc. of ICCAD 2002, San Jose, CA, US; pp. 195-202 (Sep. 2002).

Miyazaki, Masayuki, et al.; "An Autonomous Decentralized Low-Power System With Adaptive-Universal Control for a Chip Multi-Processor"; ISSCC 2003, Digest of Technical Papers; San Francisco, CA, US; pp. 108-109 (Feb. 2003).

Meijer, Maurice, et al.; "On-Chip Digital Power Supply Control for System-on-Chip Applications"; ISLPED' 05; San Diego, CA, US; pp. 311-314 (Aug. 2005).

Goel, Sandeep K.; "Test Access Planning and Test Scheduling for Embedded Core-Based System Chips"; PhD Thesis; University of Twente, Enchede, NL; 165 Pages (Nov. 8, 2005).

Liu, Bin, et al; "Power Driven Placement with Layout Aware Supply Voltage Assignment for Voltage Island Generation in Dual-VDD Designs"; Design Automation, 2006 Asia and South Pacific Conference, IEEE, Piscataway, NJ, US; pp. 582 587 (Jan. 24, 2006).

Yu, Thomas Editon, et al.; "Using Domain Partitioning in Wrapper Design for IP Cores Under Power Constraints"; IEEE VLSI Test Symmposium, 2007; pp. 369-374 (May 1, 2007).

Souef, Laurent, et al; "Architecture for Testing Multi-Voltage Domain SoC" ITC 2008; IEEE, Piscataway, NJ, US; pp. 1-10; (Oct. 28, 2008).

Cadence Datasheet; "SoC Encounter System"; 4 pages; Retrieved from http://www.cadence.com/datasheets/SoC_EnsounterGXL.pdf (Apr. 29, 2008).

NXP, Semiconductors; "Power Breakthrough Program", retrieved from the Internet http://nww.nxp.com/it/corit/services/technology-programs/html/power_breakthrough_program.html.

"Inventive: Cadence Low-Power Solution", Cadence presentation, dated May 9, 2007 (but marked as confidential at that date), downloaded Apr. 29, 2008 from: http://www.itworld.co.kr/event/cadence/tot2007/download/B_1.pdf (see particularly pp. 10, 16, 26, 27 and 53).

"A Practical Guide to Low-Power Design, User Experience With CPF"; Power Forward; 2008; p. 1-110.

International Search Report and Written Opinion for Application PCT/IB2009/054980 (Mar. 10, 2010).

* cited by examiner

TESTABLE INTEGRATED CIRCUIT AND TEST METHOD THEREFOR

FIELD OF THE INVENTION

The present invention relates to an integrated circuit comprising a plurality of cores, at least some of the cores being located in different power domains, each core being surrounded by a test wrapper comprising a plurality of wrapper cells.

The present invention further relates to a method of testing such an integrated circuit.

BACKGROUND OF THE INVENTION

Nowadays, integrated circuits (ICs) are capable of performing multiple functions, as facilitated by the ability to integrate millions of semiconductor devices such as transistors, resistors and the like onto a substrate. In fact, the complexity of such ICs has become such that distributed design approaches have been developed in which functional blocks have been defined as building blocks of the IC, with the IC being designed by the selection of predefined functional blocks. An example of such a design strategy is the System-on-Chip (SoC) approach, where multiple functional blocks, also referred to as cores, are grouped together during the design process to build an IC having the desired functionality. This approach reduces the complexity of the design task, thus reducing the time-to-market of such ICs.

A problem associated with complex ICs such as SoCs is that due to the high number of power-consuming semiconductor devices in the circuit, the overall power consumption of the IC may be unacceptably high, for instance because the power source of the IC is a battery in which case power consumption should be limited to extend the battery life or because its peak power consumption can in fact damage the IC by overheating.

Consequently, efforts have been made to come up with innovative solutions to reduce the power consumption of such complex ICs. Such innovative solutions include power gating, in which a functional block is powered down to a sleep mode or completely disconnected from the power supply when not being used, and multiple supply voltage solutions, where different circuit parts such as individual cores are powered from separate power supplies, and combinations of these solutions.

The application of multiple supply voltages allows each circuit part to operate at its own optimal supply voltage that matches its desired performance, thus optimizing overall system performance and power consumption. The power gating functionality may be used to reduce the overall IC power consumption by minimizing the leakage currents from an idle circuit part. In the remainder of this application, the combination of the multiple supply voltage approach and the power gating concept will be referred to as multiple power domains.

Multiple power domain ICs typically comprise interfacing circuitry in between power domains, or in between the power domain and the chip boundary. This interface circuitry concerns voltage level converters, also known as level shifters, and clamp circuits. A level shifter translates one voltage level to another voltage level, for example, from a low (0.9V) to a high-supply (1.2V) voltage or vice versa.

Clamp circuits are used to provide a defined logic level while a circuit part is in standby operation, e.g. in a power gated mode. In this case, the internal nodal voltages of the circuit part are floating. The purpose of both level shifters and clamp circuits is to prevent short-circuit current in the receiving circuit part, since such short-circuit currents may give significantly contribute to the overall leakage current of the IC.

In modern system-on-chip (SoC) designs, the functional blocks, i.e. cores, are deeply embedded in the IC such that the core terminals are not directly accessible from the SoC pins. This necessitates the existence of test-access paths from the SoC primary pins to an embedded core and vice versa with sufficient bandwidth to fulfil the test requirement of the core.

In case of core-based testing or power domain based testing, every power domain (or core) is isolated from its environment by means of an isolation shell or wrapper. Every functional connection going in and out of the wrapper has a wrapper isolation cell, which will also be simply referred to as a wrapper cell in this application. An example of such a wrapper is the CTAG TestShell or IEEE 1500 wrapper, which is a wrapper that is compliant with the IEEE 1500 standard for testing digital SoC ICs.

The wrapper cells provide controllability and observability at the core terminals. In principle there is one wrapper cell for every core terminal, although some core terminals do not have a wrapper cell associated with them. There are multiple types of wrapper cells, e.g., depending on the direction of core terminals, such as input, output, and bi-directional. The wrapper cells can be implemented from basic logic gates from the digital standard library.

In single supply voltage environments, the test hardware including the wrappers is powered by the same power supply as the core. However, for an IC comprising multiple power domains, this powering strategy must be reconsidered, because the core supply may be power-gated while at least a part of the wrapper, for instance its bypass register, needs to be active because it forms part of the communication path to or from another core under test.

In addition, the wrappers must be able to cope with the different signal voltages that are the consequence of the multiple power domains. This implies the need for level shifters in the functional connections between wrappers. A possible implementation of such level shifters has been proposed by Synopsys. In this proposed implementation, level shifters have been placed between wrapped cores. This allows a system integrator to decide which of the functional connections need level shifting functionality. An alternative is to have a level shifter as part of the unwrapped core. However, both these approaches have the considerable disadvantage that knowledge of the overall design is required to be able to correctly place the level shifters. In addition, the designer may need to add clamping circuitry to avoid floating signal values rippling to other cores when power gating is activated. This again requires knowledge of the system, which further complicates the design process.

SUMMARY OF THE INVENTION

The present invention seeks to provide a testable IC that has multiple power domains, which can be designed with a reduced design effort.

The present invention further seeks to provide standard library cells that can be used to reduce the effort required to design such an IC.

The present invention yet further seeks to provide a method of testing such an IC.

According to an aspect of the present invention, an integrated circuit is provided comprising a plurality of cores, at least some of the cores being located in different power domains, each core being surrounded by a test wrapper comprising a plurality of wrapper cells, wherein each of said test wrappers are located in a single power domain and each plurality of wrapper cells comprises wrapper output cells each arranged to output a signal from its associated core, each of said wrapper output cells comprising an output level shifter for shifting the voltage of said signal to the voltage of the single power domain.

Consequently, a designer of such an IC no longer needs to check for test paths that cross power domain boundaries because all communications take place in a single power domain. In other words, for two interconnected wrappers, the power domains of the associated cores are no longer of relevance because signal voltages from a core under test are converted by its wrapper cells before they are forwarded to another wrapper belonging to the same power domain. Hence, the designer can use standard library cells to design the wrappers without having to consider test communications across power domain boundaries. Moreover, cores can be powered down without having to provide complex arrangements to keep their associated level shifters and/or clamp circuits powered up.

It will be appreciated that the above arrangement is particularly suitable for individually testing the cores, because only one core needs to receive test signals and the remainder of the wrappers are used to transfer test signals such as the test stimuli and test responses from and to the core under test, e.g. through their bypass registers.

The present invention has been based on the insight that a low-voltage to a high-voltage conversion requires a level shifter. Contrarily, even though for a high-voltage to low-voltage conversion a level converter is required, such a down conversion is less critical, such that it may be realized using a standard CMOS gate. Preferably, the inter-core communication network is operated at a voltage that is equal or higher than the core voltage, such that the input side of the cores do not require dedicated level shifters because standard CMOS gates can handle this voltage mismatch. However, if the inter-core communication network is operated at a voltage that is lower than the core voltage, the input wrapper cells may require low-to-high voltage level shifters as well.

In the latter situation, each plurality of wrapper cells may further comprise wrapper input cells arranged to provide a signal to its associated core, said wrapper input cells each comprising an input level shifter for shifting the voltage of the further power domain to the voltage level of its associated core.

Each wrapper output cell may comprise a primary input, a test input, a primary output and a test output; and a multiplexer responsive to an input selection signal for coupling a selected one of the primary input and the test input to the primary output, the level shifter being coupled between the primary input and the primary output, such that only signals from the core output, which must be connected to the primary input, pass through the level shifter. It is not necessary to shift the level of signals coming through the test input, because this input is typically used to connect the wrapper cell to another wrapper cell such that this signal already is at the voltage level of the further power domain.

Preferably, the multiplexer comprises the output level shifter, which facilitates the integration of the wrapper cell and/or the multiplexer as a standard cell in a technology-specific library. Such libraries are typically used by IC design tools to translate a technology-independent specification of the IC, such as a netlist, into a list of technology-specific building blocks, e.g. building blocks for use in a 90 nm CMOS technology. Such standard cells typically specify the building blocks in terms of physical dimensions, and may comprise attributes such as the physical behavior of the building block, e.g. leakage current, to facilitate behavioral simulations of the technology-specific IC design.

In an embodiment, the multiplexer comprises a first input, as second input, an output and a control terminal for receiving the input selection signal for selecting one of the first input and the second input; a selection stage comprising a plurality of series-connected transistors between a first supply line, such as the supply line of the single power domain, and ground including a first transistor connected between the first supply line and a first node, at least one of said series-connected transistors being responsive to the first input and at least one of said series-connected transistors being responsive to the selection signal; and a level shifter stage comprising a first further transistor coupled between the first supply line and a second node and a second further transistor coupled between the second node and the first input, the first further transistor having its control terminal coupled to the first node, the second further transistor having its control terminal coupled to a further supply line such as the supply line of the power domain of its associated core and the first transistor having its control terminal coupled to the first further node.

This embodiment is advantageous because it allows for the inclusion of a level shifter in the multiplexer by the addition of only two transistors to the multiplexer design, this limiting the area overhead required for the implementation of the level shifter.

Various wrapper cell implementations are feasible. In an embodiment, at least some wrapper output cells further comprise a further multiplexer responsive to a further input selection signal for coupling a selected one of the test input and the primary output to the test output, the further multiplexer comprising a further output level shifter for shifting the voltage of said signal to the voltage of the further power domain. This is for instance useful if the test input does not originate from another wrapper cell but from a signal source in a different power domain.

In a preferred embodiment, at least some of the wrapper output cells further comprise a data storage element between the test and the multiplexer for providing another wrapper output cell with a fixed logic value during test. Hence, such wrapper cells not only provide level shifter functionality but also clamping functionality for clamping an input external to its associated core.

The IC of the present invention may be advantageously integrated in an electronic device comprising a plurality of power supplies for powering the respective power domains of the integrated circuit. Such an electronic device will be more reliable because of the better testability of the IC of the present invention.

According to an other aspect of the present invention, a multiplexer for use in an integrated circuit of the present invention is provided, the multiplexer comprising a first input, as second input, an output and a control terminal for receiving an input selection signal for selecting one of the first input and the second input; a selection stage responsive to the first input comprising a plurality of series-connected transistors between a first supply line and ground including a first transistor connected between the first supply line and a first node; and a level shifter stage comprising a first further transistor coupled between the first supply line and a second node and a second further transistor coupled between the second node and the first input, the first further transistor having its control terminal coupled to the first node, the second further transistor having its control terminal coupled to a further supply line and the first transistor having its control terminal coupled to the first further node.

Such a multiplexer may be readily integrated in a wrapper cell such that the wrapper cell provides the desired level-shifting functionality.

According to yet another aspect of the present invention, a computer-readable medium is provided that comprises a library of standard cells for designing an integrated circuit, said library comprising a standard cell including the aforementioned multiplexer. This standard cell may comprise a wrapper cell including said multiplexer. The availability of such a standard cell in such a technology-specific design library reduces the design effort required from an IC designer, thus reducing the time-to-market of the IC.

In an embodiment, the library is made available together with a program for designing an integrated circuit, said program being arranged to, when executed on a computer, produce a technology-specific representation of the integrated circuit by selecting standard cells from said library based on an abstract specification of the integrated circuit.

According to yet another aspect of the present invention, a method of testing an integrated circuit of the present invention is provided, comprising: selecting one of the cores for testing; bringing the wrapper of the selected core in a test mode, providing the core with a test stimulus via said wrapper, capturing the response of the core to the test stimulus; shifting the voltage level of the response to the voltage of the further power domain; and communicating the test response to an output of the integrated circuit. This has the advantage that such an IC may be tested without requiring knowledge of the nature of neighboring core power domains, as previously explained.

BRIEF DESCRIPTION OF THE EMBODIMENTS

Embodiments of the invention are described in more detail and by way of non-limiting examples with reference to the accompanying drawings, wherein.

DETAILED DESCRIPTION OF THE DRAWINGS

It should be understood that the Figures are merely schematic and are not drawn to scale. It should also be understood that the same reference numerals are used throughout the Figures to indicate the same or similar parts.

Figure 1:
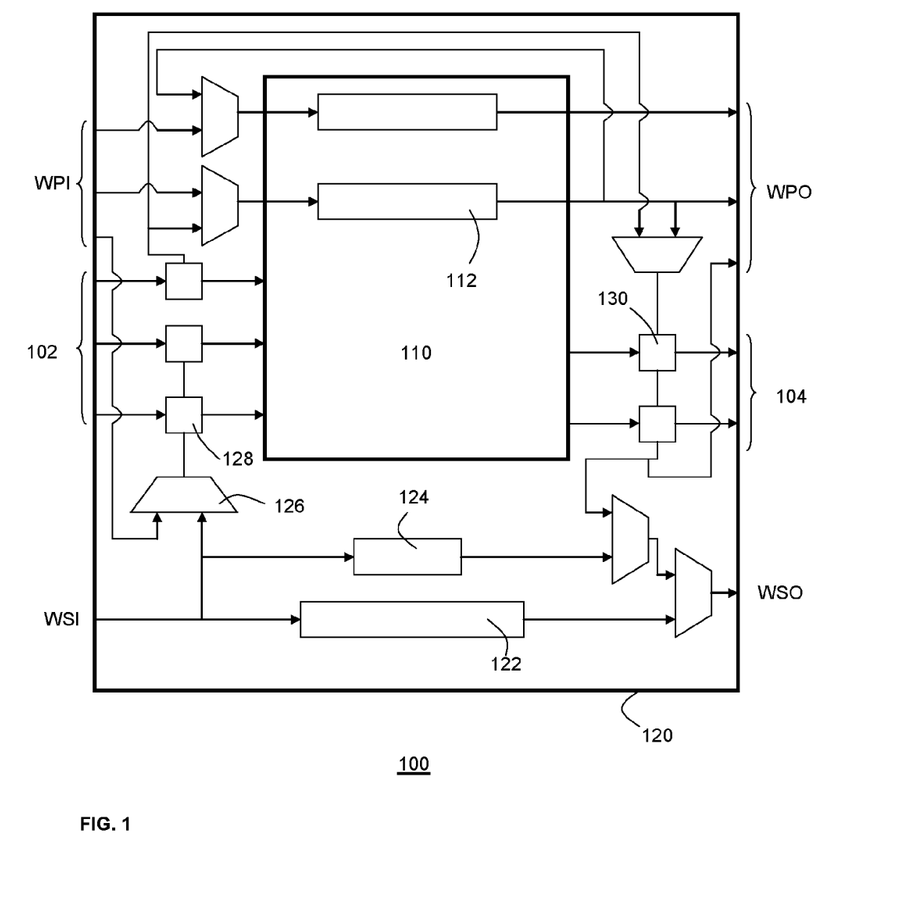
FIG. 1 schematically depicts a wrapped core of an integrated circuit.

FIG. 1 shows a portion of an IC 100 comprising a core 110 wrapped by a wrapper 120, which preferably is a wrapper compliant with the IEEE 1500 core test standard. The wrapper 120 facilitates the routing of test signals to and from the core 110 in a test mode of the IC 100. The wrapper 120 typically comprises a serial test input WSI and a serial test output WSO between which an instruction register 122 and a bypass register 124 are provided. Multiplexers 126 are typically controlled by decoding logic (not shown) coupled to the instruction register 122, i.e. by a decoded instruction shifted into this register. The IC 100 typically comprises a number of inputs 102 and a number of outputs 104 for feeding data to and from the core 110 in functional mode. The inputs 102 are coupled to the core 110 via wrapper input cells 128, and the outputs 104 are coupled to the core 110 via wrapper output cells 130. The wrapper cells are transparent in functional mode. The wrapper 120 may further comprise optional parallel inputs WPI and parallel outputs WPO, which may be coupled to internal logic (not shown) or shift registers 112 of the core 110 for invoking a parallel test of the core 110.

It is pointed out that the above is a non-limiting example of how a wrapper 120 may be configured. Many variations, for instance governed by the nature of the core 110 and/or the IC 100, are possible. The interested reader is referred to the IEEE 1500 standard document for further details of such wrapper architectures. For the present invention, the exact configuration of such a wrapper 120 is not of crucial importance, and will not be further elaborated on for reasons of brevity only.

Figure 2:
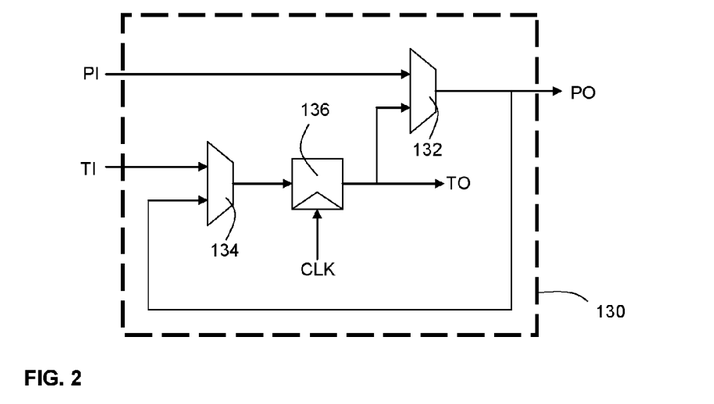
FIG. 2 schematically depicts a known wrapper isolation cell.

FIG. 2 shows a known wrapper isolation cell in more detail. In known wrapper architectures, all wrapper isolation cells, i.e. wrapper input cells 128 and wrapper output cells 130, share the same configuration. A primary input PI, which typically is the input used to feed signals to or from the core 110 in functional mode, is coupled to a multiplexer 132, which produces a primary output PO, which again is typically used to feed signals to or from the core 110 in functional mode. A further multiplexer 134 has test input TI, which typically is an input used to receive test data, for instance from a preceding wrapper isolation cell in a shift mode of the wrapper 120, and has a further input coupled to the primary output. The output of the further multiplexer 134 is coupled to a further input of the multiplexer 132 via a data storage element 136 such as a flip-flop, which may be controlled by a clock such as the test clock TCK. The further multiplexer 134 further produces a test output TO, which may serve as a connection to a successor wrapper isolation cell in said shift mode. The multiplexer 132 and further multiplexer 134 are typically controlled by respective control signals generated by the aforementioned decoding logic.

Figure 3:
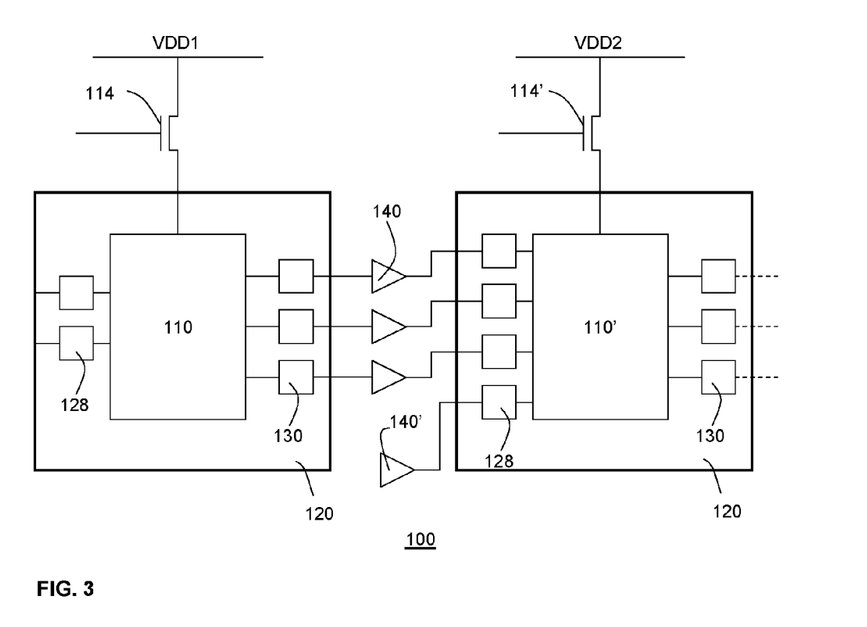
FIG. 3 schematically depicts a known multi-power domain IC architecture.

FIG. 3 shows a configuration of an IC 100 comprising multiple power domains as known in the prior art. A core 110 powered by a first power domain VDD1 is connected to a core 110' powered by a second power domain VDD2. For instance, core 110 may be operated by a voltage swing of 1.2 V and core 110' may be operated by a voltage swing of 0.9 V. The cores 110 and 110' may be power-gated cores, as illustrated by power switches 114 and 114'. In order to avoid incompatibility issues in the communication between core 110 and core 110', a number of level shifters 140 are provided in the communication paths between these cores to avoid signal integrity issues such as cross-talk, noise and the occurrence of large short circuit currents caused by the voltage mismatch. The level shifters 140 convert the voltage level of the signals from core 110 to the voltage level of core 110', e.g. from 1.2 V to 0.9 V in the given example. In case the core 110' receives signals from different power domains, further level shifters 140' may be required.

As previously explained, the arrangement shown in FIG. 3 has several drawbacks. The IC designer must have knowledge of the actual configuration of the IC 100 to ensure that the correct level shifters 140 are inserted in the IC design. Also, during test, one of the two cores may actually be power-gated. Yet, the wrapper 120 of such a power-gated core should still be active because the various wrappers 120 typically form a chain, e.g. a daisy-chain, to communicate test data to and from the external pins of the IC 100. This means that both wrappers 120 and level shifters 140 must remain powered-up. Because the wrappers 120 and the level shifters 140 are typically powered by the power domain of a core, complex measures have to be taken to ensure that the design for testability (DfT) hardware sharing the power domain of a core remains powered up when the core is powered down.

Figure 4:
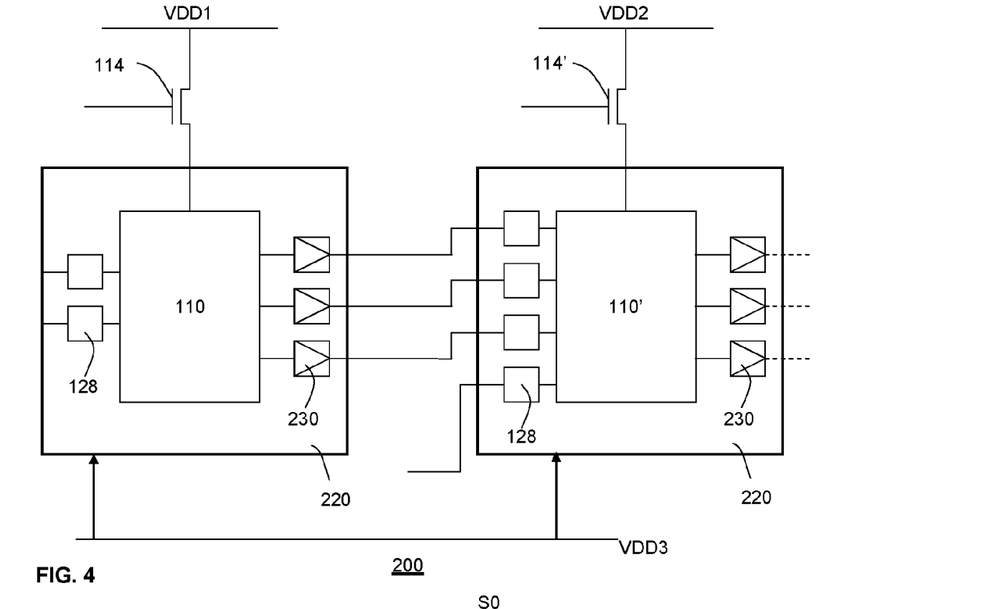
FIG. 4 schematically depicts a multi-power domain IC architecture in accordance with an embodiment of the present invention.

FIG. 4 shows an IC 200 in accordance with an embodiment of the present invention. In this embodiment, the cores 110 and 110' are wrapped by wrappers 220, which comprise wrapper output cells 230 including level shifting functionality. The wrappers 230 are powered by a dedicated further power domain VDD3, such that the cores 110 and 110' may be power-gated without affecting the mode of the wrappers 220. This significantly reduces the complexity of the IC design. The level shifters in the wrapper output cells 230 are configured to produce an output voltage that corresponds with the voltage of the further power domain VDD3. Consequently, all inter-core communications in the IC 200 take place at the voltage of the further power domain VDD3 such that voltage mismatch issues originating from the multiple power domains of the various cores 110, 110' are avoided.

It will be understood that in order for a core such as core 110 to receive signals on its inputs at the correct voltage level, either during test or in functional mode, further level shifters (not shown) may be provided, as previously explained. In an embodiment, these further level shifters are integrated in the wrapper input cells such that wrapper input cells 128 may be replaced with wrapper cells 230. In an alternative embodiment, the further level shifters may be placed at the core inputs, i.e. between the wrapper input cells 128 and the internal logic of the core 110. Consequently, in test mode as well as in functional mode, all IC communication takes place in the further power domain VDD3.

It should be appreciated that FIG. 4 shows two cores 110, 110' for reasons of clarity only and that an IC 200 may have any number of cores, some of which may share power domains, some of which may not comprise wrappers 220 and some of which who may not be power-gated. Other variations will be apparent to the skilled person.

Figure 5:
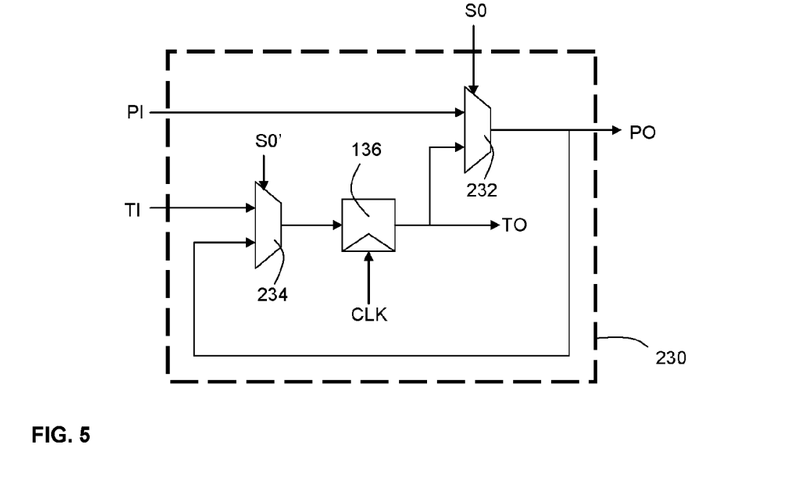
FIG. 5 schematically depicts a wrapper isolation cell in accordance with an embodiment of the present invention.

FIG. 5 depicts an embodiment of a wrapper output cell 230. In comparison to the wrapper cell 130 shown in FIG. 2, the multiplexer 132 and the further multiplexer 134 are replaced by a multiplexer 232 and further multiplexer 234 each comprising an integrated level shifter. There exist various scenarios in which the input and output voltage swings of the wrapper output cell 230 are different. The voltage swing of the wrapper cell inputs PI, TI is either determined by the voltage level of the sending core in the case of input PI, or comes from a common voltage from the communication infrastructure, e.g. a previous wrapper cell in case of input TI.

Generally speaking, signals of magnitude $V_{swing1}$, e.g. VDD1 arrive at both wrapper cell inputs PI and TI, while the wrapper output signal voltage is $V_{swing2}$, e.g. VDD3, where $V_{swing1}$ typically is different to $V_{swing2}$. The level shifting multiplexer 232 translates the signal swing from $V_{swing1}$ to $V_{swing2}$ for one of its inputs, i.e. PI such that its output is always at $V_{swing2}$, which is the voltage of the communication infrastructure in between cores of the IC 200. In case the input signals are floating, which may for example be the case when the core providing these signals is power-gated, the multiplexers 232 and 234 can be controlled to avoid selection of these inputs, thereby, setting stable values at the wrapper cell output.

In an alternative embodiment input TI is provided by another wrapper cell or another part in the wrapper, there is no need to include two voltage-shifting multiplexers in the wrapper output cell 230. In this case, input TI has already a voltage swing of $V_{swing2}$. In this embodiment, TI can only receive signals at the common voltage, such that further multiplexer 234 may be replaced by a conventional multiplexer without level shifter, e.g. a multiplexer 134.

Figure 6:
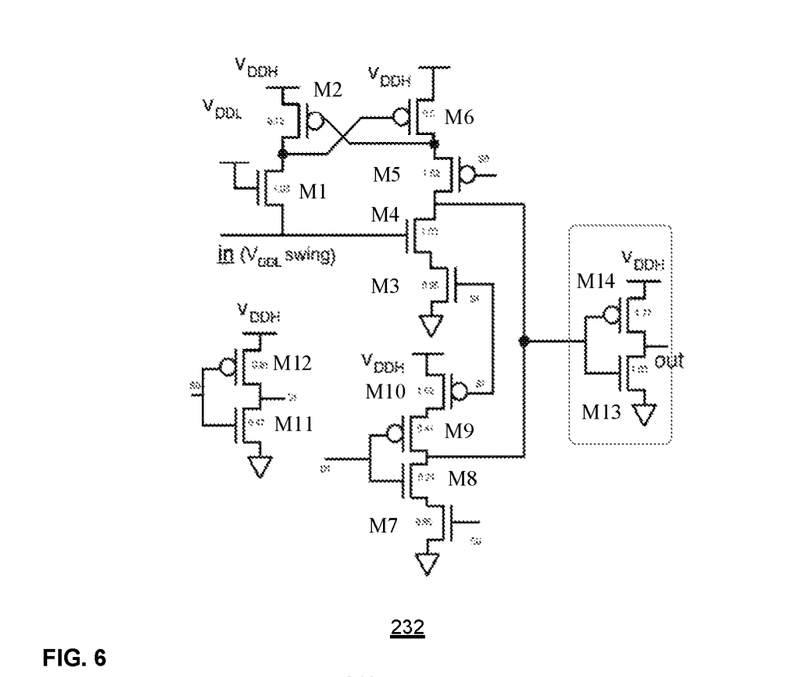
FIG. 6 schematically depicts a multiplexer for use in a wrapper isolation cell in accordance with an embodiment of the present invention.

FIG. 6 depicts a preferred embodiment of the multiplexer 232 (and further multiplexer 234). In FIG. 6, supply rail $V_{DDH}$ refers to the wrapper (or communication) power supply VDD3, while supply rail $V_{DDL}$ refers to the core power supply. It is reiterated that only one of the multiplexer inputs needs to be level-converted. The two data inputs of the multiplexer 232 are labeled in, and involve transistors M1 up to M6, and d1, which involved transistors M7 up to M10. Only input in, which is typically associated with wrapper cell input PI, is level-converted, whereas input d1, which typically is connected to the output of further multiplexer 234, does not include level-shifting functionality. The selection input is s0. The level conversion is realized by the addition of only two transistors M1, M2 to a conventional multiplexer implementation. An amplifying buffer stage formed by transistors M13, M14 may be added to increase signal strength and quality. An inverter formed by transistors M11 and M12 may be present to invert the control signal S0.

In operation, the level conversion at the MUX input stage in is effected by the cross-coupled PMOS transistors M2, M6. The NMOS transistor M1 is biased in the linear region, thereby acting a resistance. The operation of this example circuit is as follows. For an input transition of input in from a logic '0' to a logic '1', NMOS M1 and PMOS M6 are initially conductive. After receiving the logic '1' at the input in, the NMOS transistor M3 and the PMOS transistor M2 become conductive, while the PMOS transistor M6 becomes non-conductive.

This transition is only propagated through the multiplexer when the input in is selected by the selection signal s0, e.g. by means of a logic '0'. When input in is selected in this case, the voltage level $V_{DDL}$ of the input signal from the core is converted to an output voltage level $V_{DDH}$. In case the selection signal s0 is a logic '1', the second input D1 of the multiplexer is selected, and will be propagated to the MUX output out instead. The output stage formed by transistors M13 and M14 is merely used for buffering and increasing the output drive capability of the multiplexer.

The presence of the data storage element 136 in the wrapper output cell 230 further makes it possible to use a wrapper cell as a clamp circuit, which may be useful if a core is required to provide a constant output at all times (during test), which may be difficult to achieve if the core is power-gated, which typically causes its outputs to float.

Traditionally, one of the commonly used clamp circuits is a basic AND gate, where one logic input is placed in the functional path while the other input is used as clamp enable. However, in accordance with an embodiment of the present invention, such gating circuitry may be omitted because the multiplexer 232 has an embedded clamp functionality, which is controlled by driving the selection signal s0 to a 'high' value. In this way, the wrapper output cell 232 is placed in test mode, i.e. both s0 and s0' are a logic '1', with the clamp value being determined by a data value stored in the data storage element 136 of a previous wrapper output cell. This has the advantage that where the wrapper cell 232 is used in a clamp mode, during which update of its own data storage element 136 (if present) is no longer possible, the clamp value can still be updated by loading the appropriate value in the data storage element of the previous wrapper output cell. Such a clamp mode may for instance also be used by a power controller in the functional mode of a core to ensure that a power-gated core produces stable and predefined data signals on its outputs.

Alternative implementations to include clamp functionality in the multiplexer 132 are also possible. For example, the inverter formed by transistors M11 and M12 may be replaced by a 2-input NAND gate (not shown), with one of the NAND gate inputs being a negated clamp signal, with the test control block (not shown) of the wrapper 220 simultaneously controlling all the multiplexers 232 in the wrapper output cells 230 of the wrapper 220.

The multiplexer 232 may be made available as a standard cell in a semiconductor technology library, either as a standalone cell or as part of a standard cell comprising wrapper output cell 230. Such a library may be made available on any suitable computer-readable data storage medium, e.g. DVD, CD, internet-accessible hard disk and so on. The library may be made available together with an IC design program capable of translating an abstract description of an IC into a technology-specific layout by selecting appropriate standard cells from such a library. Such design programs are sometimes referred to as synthesis tools.

Figure 7:
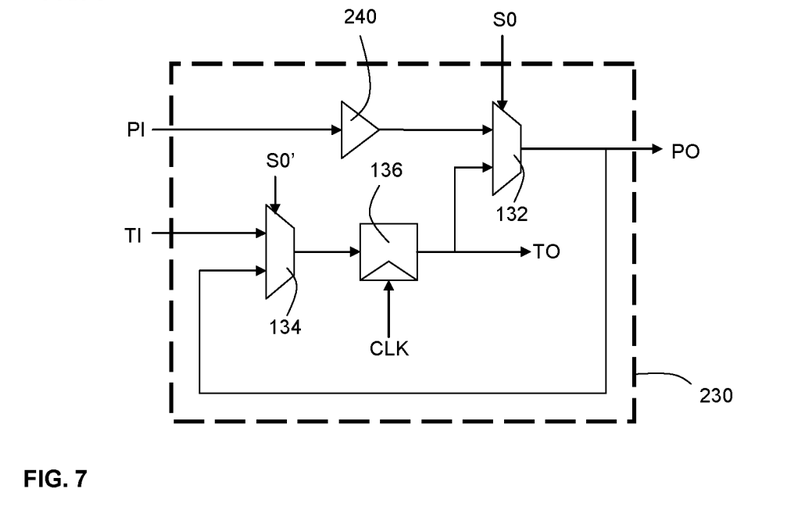
FIG. 7 schematically depicts a wrapper isolation cell in accordance with another embodiment of the present invention.

FIG. 7 shows an alternative embodiment of the wrapper output cell 230, in which a separate level shifter 240 is placed between input PI and a conventional multiplexer 132.

Figure 8:
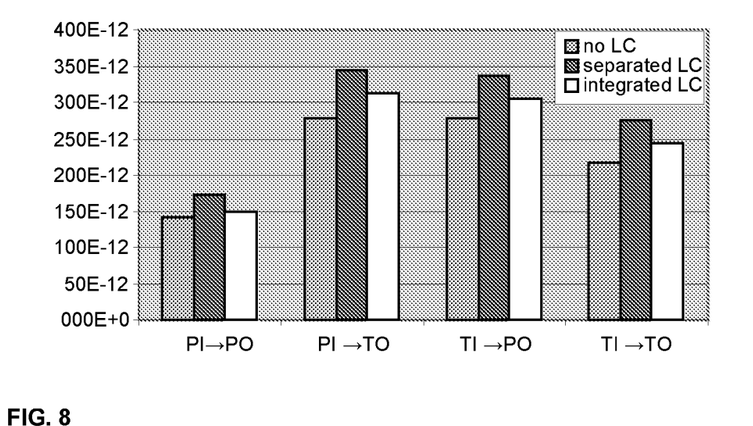
FIG. 8 shows a comparison of the performance of ICs having different types of wrapper cells.
Figure 9:
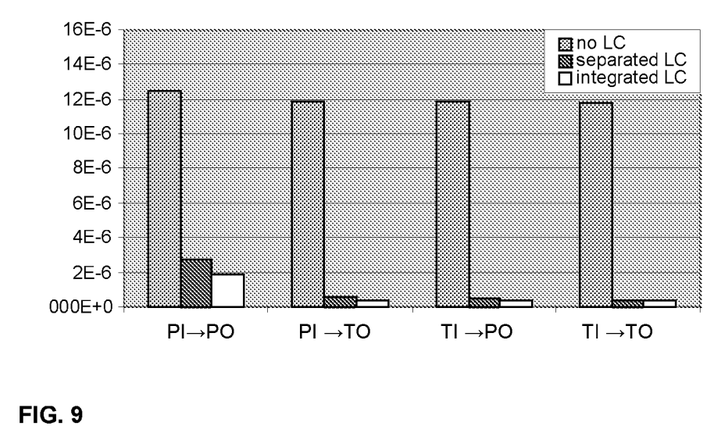
FIG. 9 shows a comparison of the power consumption of ICs having different types of wrappers.

FIGS. 8 and 9 respectively compare the performance in terms of signal propagation speed (FIG. 8) and power consumption (FIG. 9) of various wrapper cells in a 90 nm CMOS technology. The considered wrapper cells are:

1) a traditional prior art test wrapper isolation cell 130 such as shown in FIG. 2 with no level shifting and clamping, 2) a wrapper isolation cell 230 using a stand-alone level shifter 240 and clamp 136 as shown in FIG. 7, and 3) a wrapper isolation cell 230 with a multiplexer 232 comprising an integrated level shifter and clamp 136 according to the preferred embodiment shown in FIG. 6.

The input voltage of PI and TI is set to $V_{swing1}$=0.7V emulating a signal from a low-power core, while the output voltage has a nominal swing of $V_{swing2}$=1.2V, emulating a possible voltage swing value of the inter-core communication infrastructure.

It is demonstrated that the traditional prior art wrapper cell 130 is the fastest, but suffers from a high power consumption due to short-circuit currents caused by voltage mismatches. The wrapper cells 2 and 3 according to embodiments of the present invention offer a significant power reduction by ~4.5× and 6.8×, respectively. The delay penalty for the transparent mode PI→PO is up to ~23% for wrapper cell 2 but only up to ~6% for the preferred embodiment, i.e. the wrapper cell of FIG. 6, compared to the reference case without level shifters.

Hence, it is demonstrated that a significant power reduction may be achieved at the cost of little performance reduction only.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising a plurality of cores, at least some of the cores being located in different power domains, each core being surrounded by a test wrapper comprising a plurality of wrapper cells, wherein each of said test wrappers are located in a single power domain and each plurality of wrapper cells comprises wrapper output cells each arranged to output a signal from its associated core, each of said wrapper output cells comprising an output level shifter for shifting the voltage of said signal to the voltage of the single power domain.

2. The integrated circuit of claim 1, wherein each plurality of wrapper cells further comprises wrapper input cells each arranged to provide a signal to its associated core, each wrapper input cell comprising an input level shifter for shifting the voltage of the single power domain to the voltage of the power domain of its associated core.

3. The integrated circuit of claim 1, wherein each wrapper output cell comprises:
   a primary input, a test input, a primary output and a test output; and
   a multiplexer responsive to an input selection signal for coupling a selected one of the primary input and the test input to the primary output, the level shifter being coupled between the primary input and the primary output.

4. The integrated circuit of claim 3, wherein the multiplexer comprises the level shifter.

5. The integrated circuit of claim 4, wherein the multiplexer comprises a first input, a second input, an output and a control terminal for receiving the input selection signal for selecting one of the first input and the second input;
   a selection stage comprising a plurality of series-connected transistors between the supply line of the single power domain and ground including a first transistor connected between said supply line and a first node, at least one of said series-connected transistors being responsive to the first input and at least one of said series-connected transistors being responsive to the selection signal;
   a level shifter stage comprising a first further transistor coupled between the said supply line and a second node and a second further transistor coupled between the second node and the first input, the first further transistor having its control terminal coupled to the first node, the second further transistor having its control terminal coupled to a supply line of the power domain of its associated core and the first transistor having its control terminal coupled to the first further node.

6. The integrated circuit of claim 3, wherein at least some wrapper output cells further comprise a further multiplexer responsive to a further input selection signal for coupling a selected one of the test input and the primary output to the test output.

7. The integrated circuit of claim 6, wherein the further multiplexer comprises a further output level shifter for shifting the voltage of said signal to the voltage of the single power domain.

8. The integrated circuit of claim 3, wherein at least some of the wrapper output cells further comprise a data storage element between the test input and the multiplexer for providing another wrapper output cell with a fixed logic value during test.

9. An electronic device comprising the integrated circuit of claim 1, the electronic device comprising a plurality of power supplies for powering the respective power domains of the integrated circuit.

10. A multiplexer for use in an integrated circuit of claim 1, the multiplexer comprising a first input, a second input, an output and a control terminal for receiving the input selection signal for selecting one of the first input and the second input;
  a selection stage comprising a plurality of series-connected transistors between a first supply line and ground including a first transistor connected between said supply line and a first node, at least one of said series-connected transistors being responsive to the first input and at least one of said series-connected transistors being responsive to the selection signal;
  a level shifter stage comprising a first further transistor coupled between the said supply line and a second node and a second further transistor coupled between the second node and the first input, the first further transistor having its control terminal coupled to the first node, the second further transistor having its control terminal coupled to a further supply line and the first transistor having its control terminal coupled to the first further node.

11. A non-transitory computer-readable medium comprising a library of standard cells for designing an integrated circuit, said library comprising a standard cell including the multiplexer of claim 10.

12. The non-transitory computer-readable medium of claim 11, wherein the standard cell comprises a wrapper cell including said multiplexer.

13. The non-transitory computer-readable medium of claim 12, wherein the wrapper cell comprises a primary input, a test input, a primary output and a test output; and wherein the multiplexer has a control input for receiving an input selection signal for coupling a selected one of the primary input and the test input to the primary output.

14. The non-transitory computer readable medium of claim 11, further comprising a program for designing an integrated circuit, said program being arranged to, when executed on a computer, produce a technology-specific representation of the integrated circuit by selecting standard cells from said library in response to an abstract specification of the integrated circuit.

15. A method of testing an integrated circuit according to claim 1, comprising:
  selecting one of the cores for testing;
  bringing the wrapper of the selected core in a test mode,
  providing the core with a test stimulus via said wrapper,
  capturing the response of the core to the test stimulus;
  shifting, in an wrapper output cell, the voltage level of the response to the voltage of the single power domain; and
  communicating the test response to an output of the integrated circuit.

* * * * *